United States Patent [19]

Lebowitz et al.

[11] Patent Number: 4,653,177

[45] Date of Patent: Mar. 31, 1987

[54] METHOD OF MAKING AND SELECTIVELY DOPING ISOLATION TRENCHES UTILIZED IN CMOS DEVICES

[75] Inventors: Joseph Lebowitz, Watchung, N.J.; Thomas E. Seidel, Carlsbad, Calif.

[73] Assignee: AT&T Bell Laboratories, Murray Hill, N.J.

[21] Appl. No.: 758,717

[22] Filed: Jul. 25, 1985

[51] Int. Cl.⁴ .............................................. H01L 21/78
[52] U.S. Cl. .................................. 29/578; 29/576 W; 29/580; 29/571; 148/1.5; 148/187
[58] Field of Search ................ 29/576 W, 577 C, 578, 29/580; 148/187, 1.5, DIG. 82; 429/93; 357/47, 48, 49, 50

[56] References Cited

U.S. PATENT DOCUMENTS

| | | | |
|---|---|---|---|
| 4,104,090 | 8/1978 | Pogge | 148/175 |
| 4,140,558 | 2/1979 | Murphy et al. | 148/175 |
| 4,244,752 | 1/1981 | Henderson et al. | 148/1.5 |
| 4,380,865 | 4/1983 | Frye et al. | 29/576 W |
| 4,406,710 | 9/1983 | Davies et al. | 148/1.5 |
| 4,472,212 | 9/1984 | Kinsbron | 148/188 |
| 4,515,371 | 11/1983 | Soclof | 148/1.5 |
| 4,534,824 | 8/1985 | Chen | 156/628 |
| 4,569,701 | 2/1986 | Oh | 148/188 |
| 4,571,819 | 2/1986 | Rogers et al. | 29/576 W |
| 4,597,164 | 7/1986 | Havemann | 29/576 W |
| 4,604,150 | 8/1986 | Lin | 148/188 |

OTHER PUBLICATIONS

*IEEE Transactions on Electron Devices*, vol. ED-32, No. 2, Feb. 1985, "Anodic Oxidation of Si in Oxygen/Chlorine Plasma", by N. Haneji, pp. 100–105.

*IEEE Transactions on Electron Devices*, vol. ED-27, No. 8, Aug. 1980, "Selective Anodic Oxidation of Silicon in Oxygen Plasma" by V. Q. Ho et al, pp. 1436–1443.

*Primary Examiner*—Brian E. Hearn
*Assistant Examiner*—Tuan Quach
*Attorney, Agent, or Firm*—Lucian C. Canepa

[57] ABSTRACT

It is known to utilize dielectric-filled trenches in a CMOS integrated-circuit device to achieve electrical isolation between adjacent n-channel and p-channel regions. In that way, latchup-free operation of the device is ensured. But inversion effects along the walls of the trenches can cause high leakage currents, undesirably high parasitic capacitances and even shorting together of source/drain regions. In accordance with the invention, a nonlithographic technique including selective anodic oxidation is employed to selectively mask the sidewalls of the trenches. Each sidewall can then be independently doped thereby effectively eliminating the possibility of inversion occurring therealong.

6 Claims, 6 Drawing Figures

METHOD OF MAKING AND SELECTIVELY DOPING ISOLATION TRENCHES UTILIZED IN CMOS DEVICES

BACKGROUND OF THE INVENTION

This invention relates to integrated-circuit devices made in complementary-metal-oxide-semiconductor (CMOS) form and, more particularly, to a method for fabricating isolation trenches in such devices.

It is known to utilize dielectric-filled trenches in a CMOS device to achieve isolation between adjacent n-channel and p-channel transistor regions. In that way, latchup-free operation of a CMOS device can be ensured.

In a CMOS device utilizing trenches for isolation, inversion layers may form along the sidewalls of the trenches. Such layers can deleteriously affect device performance by causing transistors adjacent to the trenches to exhibit undesirably high leakage to the device substrate. In some cases, the sidewall inversion layers can actually lead to device failure by causing source/drain regions along the sidewalls to be shorted together.

Selectively doping the sidewalls has the potential to eliminate or substantially reduce inversion effects in a trench-isolated CMOS device. But such an approach, which requires that each sidewall of a trench be doped independently, is made exceedingly difficult by the extremely narrow and deep structure of typical trenches in a very-large-scale-integrated (VLSI) CMOS device. Available lithographic techniques, for example, are not feasible for selectively masking the sidewalls of such trenches to establish a basis for selective doping.

Efforts were therefore directed by workers skilled in the art aimed at trying to devise an effective approach for carrying out the aforespecified selective doping. It was recognized that such efforts, if successful, had the potential for making a significant contribution to the realization of a highly reliable latchup-free VLSI CMOS device of the trench-isolation type.

SUMMARY OF THE INVENTION

Hence, an object of the present invention is an improved trench-isolated CMOS device. More specifically, an object of this invention is a fabrication procedure for selectively doping the trench sidewalls of a CMOS device.

Briefly, these and other objects of the present invention are realized in a specific illustrative CMOS device that includes dielectric-filled trenches utilized to isolate adjacent n-channel and p-channel regions in a silicon body. In accordance with the principles of this invention, n- and p-type regions of each trench are independently doped in a unique fabrication sequence that involves nonlithographically forming a dopant mask only on the p-type regions of the trench.

In accordance with applicants' invention, the mask on the p-type regions of the trench is formed by selective anodization. In one embodiment, the p-type regions are preferentially etched and rendered porous in a wet anodization step. The porous silicon is then oxidized to form a mask layer made of silicon dioxide. In another embodiment, the p-type regions of each trench are selectively converted to silicon dioxide in a one-step dry anodization procedure carried out in a plasma.

After forming a mask on the p-type regions of each trench by either of the techniques outlined above, an n-type dopant is introduced into the n-type trench regions. Subsequently, the mask is removed and a p-type dopant is introduced into all the trench regions. In the n-type trench regions, this p-type dopant partially compensates the priorly introduced n-type dopant. But the net n-type dopant concentration thereby established in the n-type regions of the trenches and the p-type dopant concentration established in the p-type regions are each such as to raise the dopant concentration to a level at which none of the aforedescribed inversion effects will occur in the isolation trenches of a CMOS device during normal operating conditions.

BRIEF DESCRIPTION OF THE DRAWING

A complete understanding of the present invention and of the above and other features and advantages thereof may be gained from consideration of the following detailed description presented hereinbelow in connection with the accompanying drawing, not drawn to scale, in which.

DETAILED DESCRIPTION

Figure 1:
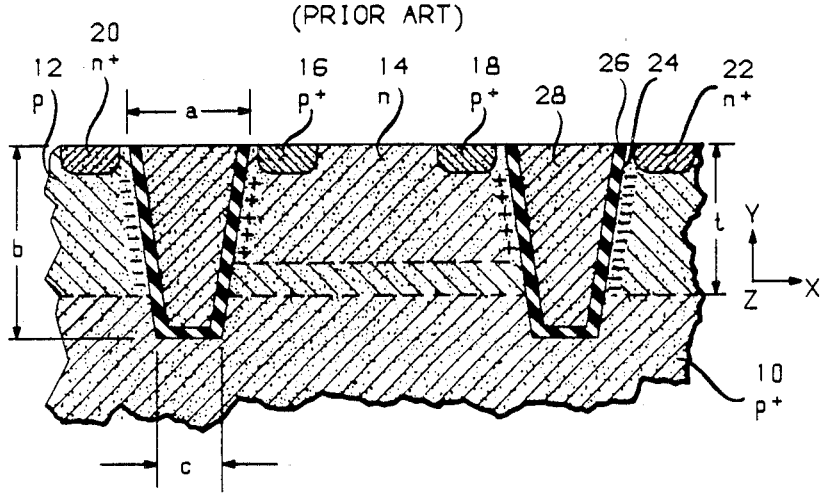
FIG. 1 is a cross-sectional depiction of a portion of a standard CMOS device that includes dielectric-filled isolation trenches.

The specific illustrative structure shown in FIG. 1 comprises a portion of a conventional CMOS device. The device includes a p+ region 10 having a p-type epitaxial layer 12 formed thereon. By way of example, the thickness t of the layer 12 is approximately 5.0 micrometers ($\mu$m).

In a manner well known in the art, n-type tubs are formed in the layer 12. One such tub 14 is shown in FIG. 1. Source and drain regions of typical p-channel MOS transistors formed in the tubs 14 are represented in FIG. 1 by p+ regions 16 and 18.

MOS transistors of the n-channel type are also formed in the device structure of FIG. 1. These transistors are defined in portions of the p-type layer 12 that have not been converted to n-type tubs or, alternatively, can be formed within p-tubs (not shown) of a conventional twin-tub CMOS device. In any case, source and drain regions of typical such n-channel transistors are represented in FIG. 1 by n+ regions 20 and 22.

Trenches are utilized in the FIG. 1 CMOS device to achieve electrical isolation between adjacent n-channel and p-channel transistor regions. (In that way, as previously discussed, latchup-free operation of the device can be ensured.) One such trench 24 that completely surrounds n-type tub 14 is depicted in FIG. 1. The dimensions a, b and c of the indicated trench are, for example, approximately 1.25, 5.5 and 0.25 $\mu$m, respectively.

After being formed in conventional ways known in the art, the trench 24 shown in FIG. 1 is filled with dielectric material. Illustratively, this involves initially growing a 1000-Angstrom-unit (Å)-thick layer 26 of silicon dioxide on the walls and bottom of the trench 24. The trench 24 is then filled and overstuffed with a relatively thick layer of undoped polycrystalline silicon that covers the entire top surface of the depicted device structure. Subsequently, after a standard planarization step, the poly layer 28 filling the trench 24 appears as shown in FIG. 1.

In practice, the n-type tub 14 of the CMOS device represented in FIG. 1 is typically connected to a positive voltage such as +5 volts and the p+ region 10 (and thus the p-type layer 12) is connected to a point of reference potential such as ground. A potential difference thus appears across each dielectric-filled trench of the device. As a result, it is possible for the doped region on one side of a trench to act as a gate with respect to the doped region on the other side thereof. In turn, this can cause an inversion layer to form along the sidewalls of each trench. Additionally, induced charge in the dielectric material in the trenches can itself cause inversion effects along the sidewalls or enhance the priorly described inversion effects.

The inversion layers thereby established along the trench sidewalls of the aforedescribed CMOS device are depicted in FIG. 1. An n-type inversion layer, designated by minus signs, is formed along the outer sidewall of the trench 24. Similarly, a p-type inversion layer, designated by plus signs, is formed along the inner sidewalls of the trench 24.

The p-type inversion layer represented in FIG. 1 serves as a conductive bridge between the source/drain regions 16 and 18 and the portion of the p-type layer 12 that directly underlies the n-type tub 14. As a result, relatively high leakage currents can thereby flow from the source/drain regions 16 and 18 to the p+ region 10. In turn, this deleteriously affects the operating characteristics of the constituent p-channel transistors included in the depicted device.

Further, the n-type inversion layer represented in FIG. 1 serves in effect to increase the junction area between the n+ source/drain regions 20 and 22 and the p-type region 12. In turn, this can lead to relatively high and deleterious leakage currents from the regions 20 and 22 to the p+ region 10.

Additionally, the aforedescribed inversion layers can actually cause shorting together of source/drain regions disposed along the edges of trenches. Thus, for example, the n-type inversion layer depicted in FIG. 1 can cause the n+ regions 20 and 22 and other outer-edge-adjacent n+ source/drain regions (not shown) to be directly shorted to each other. Similarly, the depicted p-type inversion layer can cause the p+ regions 16 and 18 and other inner-edge-adjacent p+ source/drain regions (not shown) to be directly shorted together. Such a result will, of course, cause catastrophic failure of the MOS transistors of which the affected source/drain regions are constituents.

The harmful effects described above can in some cases be reduced or even eliminated by forming the source/drain regions 16, 18, 20 and 22 of FIG. 1 farther from the edges of the trench 24. But such an approach seriously limits the packing density capabilities of the device. Thus, especially for VLSI CMOS devices, this approach is not an attractive one.

In accordance with the principles of the present invention, the dopant density or concentration adjacent the sidewalls of isolation trenches included in CMOS devices is selectively increased. In particular, the n-type dopant density adjacent the inner sidewall of the trench 24 shown in FIG. 1 is increased to a value that considerably exceeds the originally established density in the n-type tub 14. Similarly, the p-type dopant density adjacent the outer sidewall of the trench 24 is increased to a value that exceeds the originally established density in the p-type layer 12. In both cases, the resulting dopant density along the trench sidewalls is thereby established sufficiently high that, during normal operation of the device, no inversion layer of the respective opposite type will form along the sidewalls. Consequently, the aforedescribed deleterious effects stemming from inversion are thereby avoided.

Figure 2:
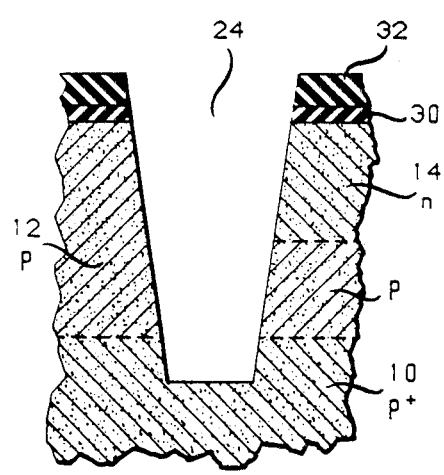
FIG. 2 shows a portion of an unfilled trench in a partially fabricated CMOS device that is to be processed in accordance with the principles of the present invention.

FIG. 2 shows a portion of the FIG. 1 device at an earlier point in the fabrication sequence therefor. Parts of FIG. 2 that correspond to parts of FIG. 1 are designated in FIG. 2 with the same respective reference numerals. Additionally, the FIG. 2 device structure includes a protective mask on the entire top surface thereof. By way of example, the mask comprises a 350-Å-thick layer 30 of silicon dioxide and a 2000-Å-thick layer 32 of silicon nitride. Thus, the only portions of the structure that are not protected by the noted two-layer mask are the sidewalls and the bottom of the trench 24.

In accordance with the principles of the present invention, the sidewalls and bottom of the trench 24 shown in FIG. 2 are next selectively masked. In accordance with one feature of this invention, this is done in accordance with a two-step procedure that includes an initial wet anodization step in which the p-type trench sidewalls and bottom, but not the n-type trench sidewalls, are etched and rendered porous.

Figure 3:
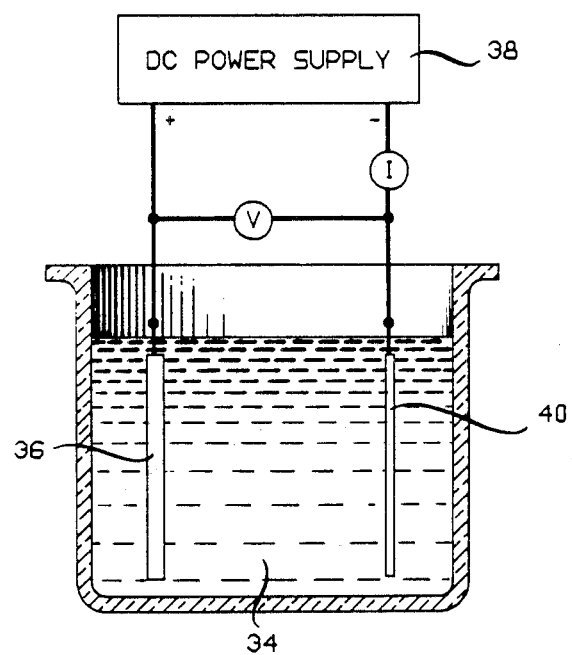
FIG. 3 shows the FIG. 2 device immersed in a wet bath during selective anodization.

FIG. 3 shows an illustrative apparatus for carrying out the wet anodization step. In FIG. 3, the entire device structure of FIG. 2 is shown immersed in an anodization bath 34. The immersed structure is designated by reference numeral 36. Illustratively, the bath 34 comprises an electrolyte containing 5 percent hydrofluoric acid in a 1:1 solution of acetic acid and water. The device structure 36 is connected to the positive terminal of a dc power supply 38 to whose negative terminal a platinum electrode 40 is connected. By passing approximately 0.75 milliamperes to theper square centimeter through the electrolyte for about 10 minutes, the p-type trench sidewalls of the device structure 36 are selectively etched and rendered porous.

Figure 4:
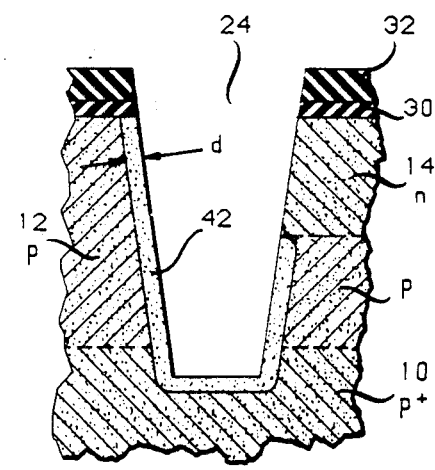
FIGS. 4 through 6 depict the device at subsequent stages of the herein-described fabrication sequence.

As indicated in FIG. 4, only p-type trench sidewall and bottom region 42 of the depicted device is etched and rendered porous in the aforedescribed wet anodization step. Ilustratively, the thickness d of the region 42 is approximately 0.22 μm.

Oxidation of the porous silicon region 42 is then carried out by exposing the device structure to oxygen in a furnace at about 900 degrees Celsius for about 5 minutes or by carrying out a rapid-thermal-annealing (RTA) step at approximately 1050 degrees Celsius for about 60 seconds. The resulting silicon dioxide region, designated by reference numeral 44 in FIG. 5, occupies about the same volume as the p-type silicon that was anodized and made porous.

During the aforedescribed oxidation step in which the silicon dioxide region 44 (FIG. 5) is formed, a thin layer (for example about 200 Å) of silicon dioxide is unavoidably formed on the n-type trench walls. This thin layer is then removed in a standard etching step. During the removal step, a thin surface layer of the region 44 is also removed. But the remaining thickness of the region 44 (typically at least about 1500 Å) is more than adequate to serve as a protective mask or barrier during a subsequent dopant enhancement step.

Next, in accordance with the principles of the present invention, an n-type dopant such as arsenic is introduced into the unmasked or n-type sidewalls of the trenches included in the herein-considered device structure to enhance the dopant concentration therein. Illustratively, an average dopant concentration of at least approximately $7 \times 10^{16}$ dopant ions per cubic centimeter is established along the n-type sidewalls in the region indicated by minus signs along the left-hand side of the tub 14 shown in FIG. 5. (The dopant concentration in other parts of the n-type tub 14 is about $10^{16}$ dopant ions per cubic centimeter.) The thickness e of the enhanced doped region is approximately 0.25 $\mu$m. In practice, for a particular illustrative CMOS device of the type assumed herein, such an enhanced region (even after being partially compensated by p-type dopant, in the manner specified later below) will not exhibit inversion effects during normal operating conditions.

Figure 5:
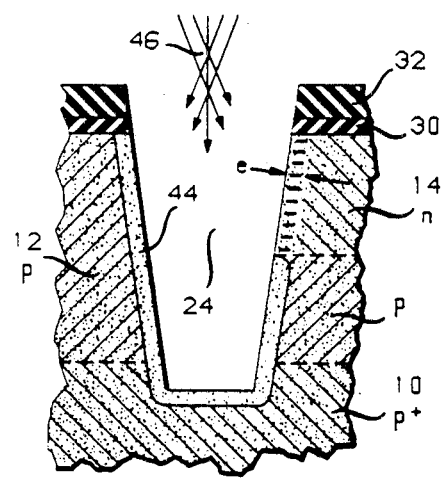

Various known techniques are available for carrying out the aforedescribed dopant enhancement step. As schematically represented in FIG. 5 by dashed arrows 46, an ion implantation procedure can be utilized for doping the unmasked n-type trench sidewalls. For steeply inclined trench walls, wobbling of the implantation source relative to the device structure may be necessary or advantageous to achieve the desired dopant enhancement in a substantially uniformly distributed manner.

Standard techniques other than ion implantation can be employed to carry out the aforedescribed dopant enhancement step. Thus, for example, an n-doped polysilicon layer (not shown) formed in the trench 24 (FIG. 5) can be utilized as a source for increasing the doping of the sidewalls of the n-type tub 14. Or other conventional solid or gaseous sources can be used to carry out this doping step. Alternatively, the advantageous technique described in U.S. Pat. No. 4,472,212 for forming shallow highly doped surface layers can be employed.

Figure 6:
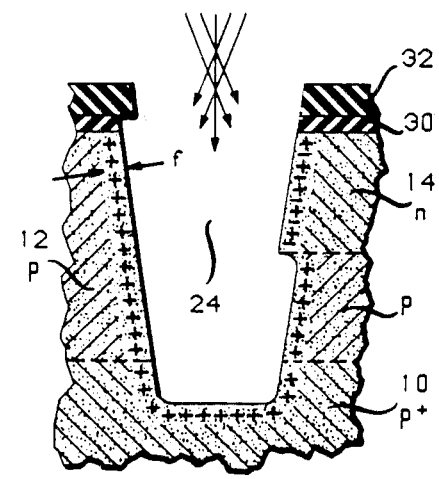

Next, in accordance with the principles of this invention, the dopant mask layer 44 shown in FIG. 5 is removed. Illustratively, this is done in a conventional wet etching step utilizing dilute hydrofluoric acid. After that step in the fabrication sequence, the contour of the trench 24 is approximately as shown in FIG. 6. Then, by any of the standard techniques previously specified, a p-type dopant such as boron is introduced into the trench bottom and sidewalls, as indicated by plus signs in FIG. 6, to enhance the dopant concentration in the p-type regions of the device along the sidewalls and bottom of each trench. Illustratively, an average dopant concentration of at least approximately $10^6$ dopant ions per cubic centimeter is established in the p-type regions. (The dopant concentrations in other parts of the p-type layer 12 and the p+ region 10 are about $3 \times 10^{15}$ and $5 \times 10^{18}$ dopant ions per cubic centimeter, respectively.) The thickness f of the enhanced p-type doped region is approximately 0.25 $\mu$m. In practice, for a particular illustrative CMOS device of the type assumed herein, such an enhanced region will not exhibit inversion effects during normal operating conditions.

As indicated in FIG. 6, p-type dopant is not only introduced into portions of the p-type regions adjoining the trench 24 but is also introduced into previously enhanced portions of the n-type region adjoining the trench. The p-type dopant thus partially compensates the n-type dopant previously introduced into the trench sidewall adjoining the tub 14. But, in accordance with the principles of this invention, the resulting net enhancement of n-type dopant concentration in the sidewall adjoining the tub 14 is designed to be sufficient to prevent the enhanced n-type region of the depicted device from exhibiting inversion effects during normal operating conditions. Illustratively, the net n-type dopant concentration in the sidewall adjoining the tub 14 is designed to be at least approximately $6 \times 10^{16}$ dopant ions per cubic centimeter.

In further accordance with the principles of the present invention, a dry rather than a wet anodization procedure can be utilized to selectively mask the trench walls of a CMOS device of the type represented in FIG. 2. In the dry approach, the p-type sidewalls and bottoms of the trenches are selectively converted to silicon dioxide in a one-step anodization procedure carried out in a plasma. Such a dry anodization procedure involves placing the device whose p-type regions are to be converted to silicon dioxide on an anode electrode in a plasma reaction chamber. Either oxygen or a mixture of oxygen and chlorine is introduced into the chamber. A plasma is then generated in the chamber. The properties of the resulting oxide selectively formed on p-type silicon portions of the device are comparable to those of thermally grown oxide.

Further details of one-step dry anodization procedures of the type described above are set forth in "Selective Anodic Oxidation of Silicon in Oxygen Plasma" by V. Q. Ho et al, *IEEE Transactions on Electron Devices*, Vol. ED-27, No. 8, August 1980, pages 1436–1443 and in "Anodic Oxidation of Si in Oxygen/Chlorine Plasma" by N. Haneji et al, *IEEE Transactions on Electron Devices*, Vol. ED-32, No. 2, February 1985, pages 100–105. These procedures are suitable for inclusion in applicants' overall inventive process.

Next, in standard ways known in the art, the structure depicted in FIG. 6 is further processed in straightforward and conventional ways, to form a complete packaged CMOS device. Such further processing includes, for example, removing the layer 32 from the top surface of the device structure and then growing a thin high-quality layer of silicon dioxide on the sides and bottom of the isolation trench 24, in the manner described above in connection with FIG. 1. Subsequently, the trenches of the device are filled with a material such as undoped polysilicon, as specified earlier. Conventional MOS transistors are then formed in the structure.

Thus, in the unique manner specified in detail herein, the walls of isolation trenches included in a CMOS device are selectively doped. In accordance with applicants' invention, this is done either in a two-step wet anodization sequence or in a one-step dry anodization procedure. In either case, the selective doping made possible thereby is the basis for avoiding deleterious inversion effects in such devices.

Finally, it is to be understood that the above-described structures and processing techniques are only illustrative of the principles of the present invention. In accordance with these principles, numerous modifications and alternatives may be devised by those skilled in the art without departing from the spirit and scope of the invention.

What is claimed is:

1. A method of independently doping n- and p-type regions of isolation trenches formed in a CMOS device, said method comprising the steps of
    nonlithographically forming a dopant mask only on the p-type region of each trench, doping only the n-type region of each trench with an n-type dopant, removing said dopant mask, and then simultaneously doping both n- and p-type regions of each trench with a p-type dopant.

2. A method as in claim 1 wherein said forming step includes selective anodization.

3. A method as in claim 2 wherein the p-type region of each trench is etched and rendered porous in a wet anodization step.

4. A method as in claim 3 wherein the p-type region of each trench is then oxidized to form a mask comprising silicon dioxide.

5. A method as in claim 2 wherein the p-type region of each trench is selectively converted to a mask comprising silicon dioxide in a one-step dry anodization procedure carried out in a plasma.

6. A method of fabricating a CMOS device of the type that includes isolation trenches between adjacent p- and n-type regions of said device, said method comprising the steps of nonlithographically forming a dopant mask only on one region of each trench, doping only the other region of each trench with a dopant of the same conductivity type as that of said other region, removing said dopant mask, and then simultaneously doping both regions of each trench with a dopant of the same conductivity type as that of said one region.

* * * * *